(12) United States Patent
Yu et al.

(10) Patent No.: US 8,138,098 B2
(45) Date of Patent: Mar. 20, 2012

(54) METHOD OF PATTERNING STACKED STRUCTURE

(75) Inventors: Chien-Hsien Yu, Hsinchu (TW); Jia-Chong Ho, Hsinchu County (TW); Yi-Kai Wang, Hsinchu (TW); Ya-Lang Chen, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 578 days.

(21) Appl. No.: 12/040,913

(22) Filed: Mar. 2, 2008

(65) Prior Publication Data

US 2009/0101899 A1    Apr. 23, 2009

(30) Foreign Application Priority Data

Oct. 19, 2007 (TW) ................................ 96139310 A (51) Int. Cl.
*H01L 21/461* (2006.01)
(52) U.S. Cl. .............. 438/745; 438/99; 257/40; 257/57; 257/E21.219; 428/523
(58) Field of Classification Search .................... 257/40, 257/57, E21.219, E29.043; 428/523; 438/99, 438/694, 745; 528/10
See application file for complete search history.

(56) References Cited

U.S. PATENT DOCUMENTS

| 4,537,851 | A | * | 8/1985 | Nonogaki et al. ............ 430/144 |
| 4,838,991 | A | * | 6/1989 | Cote et al. ........................ 216/46 |
| 6,500,604 | B1 | | 12/2002 | Dimitrakopoulos et al. |
| 2002/0022299 | A1 | | 2/2002 | Jackson |
| 2004/0041969 | A1 | * | 3/2004 | Tahon et al. .................. 349/123 |
| 2005/0165152 | A1 | * | 7/2005 | Barr et al. ..................... 524/487 |
| 2006/0046339 | A1 | | 3/2006 | Seo et al. |
| 2006/0202288 | A1 | | 9/2006 | Yamamoto et al. |
| 2006/0216852 | A1 | | 9/2006 | Suh et al. |
| 2007/0096080 | A1 | | 5/2007 | Cain et al. |
| 2007/0111371 | A1 | | 5/2007 | Ahn et al. |
| 2008/0128680 | A1 | * | 6/2008 | Anthony et al. ................ 257/40 |

FOREIGN PATENT DOCUMENTS

| CN | 1619855 | 5/2005 |
| CN | 101051671 | 10/2007 |
| WO | 2007057664 | 5/2007 |

OTHER PUBLICATIONS

Hu et al., Organic Thin Film Field-Effect Transistors, China Academic Journal Electronic Publishing House, vol. 26, 1997, p. 649-p. 653.
"1st Office Action of China Counterpart Application" issued on Dec. 18, 2009, p. 1-p. 11.
Zhang et al., "Dissolving Pentacene and Charaterizing Pantecene Thin Films Fabricated from the Solution" with English abstract, Chinese Journal of Semiconductors, vol. 27, No. 10, Oct. 2006, pp. 1771-1775.

(Continued)

*Primary Examiner* — Matthew Landau
*Assistant Examiner* — Colleen E Snow
(74) *Attorney, Agent, or Firm* — Jianq Chyun IP Office (57) ABSTRACT

A stacked structure including a soluble organic semiconductor material and a water soluble photosensitive material is provided. The water soluble photosensitive material is disposed on the surface of the soluble organic semiconductor material.

5 Claims, 6 Drawing Sheets

OTHER PUBLICATIONS

Yuan-Chuan Hu, "Characteristics and Carrier Transport Mechanism of Organic Thin Film Field Effect Transistors" with English Abstract, in partial fulfillment of the requirements for the degree of Doctor of Nature Science, Tsinghua University, Apr. 2004.

Da-Gang Wu, "Synthesis and Applications of Conductive Polyaniline Thin-Film" with English Abstract, Thesis of Master Degree, Nov. 2006.

"2ND Office Action of Chinese Counterpart Application" issued on Sep. 6, 2010, p. 1-p. 10, in which the listed references were cited.

* cited by examiner

METHOD OF PATTERNING STACKED STRUCTURE

CROSS-REFERENCE TO RELATED APPLICATION

This application claims the priority benefit of Taiwan application serial no. 96139310, filed on Oct. 19, 2007. The entirety of the above-mentioned patent application is hereby incorporated by reference herein and made a part of this specification.

BACKGROUND OF THE INVENTION

1. Field of the Invention

The present invention relates to a stacked structure and a patterning method of the same. More particularly, the present invention relates to a structure of a soluble organic semiconductor material and a method of patterning the soluble organic semiconductor material by wet etching, and an organic thin film transistor (OTFT) and array having the same.

2. Description of Related Art

Organic thin film transistors (OTFTs) are transistors fabricated by an organic conjugated polymer or oligomer material. Compared with conventional inorganic transistors, OTFTs may be fabricated at a low temperature, so light, thin, and cheap plastics replace the glass to be used as a substrate. Furthermore, OTFTs have a relatively simple process, thus having a great potential of development. In the aspect of the process, an organic semiconductor material is patterned mostly with a shadow mask. However, the minimum line width obtained by using the shadow mask is much greater than the minimum line width obtained by using an exposure and development process. The edge of the pattern is rough due to a shadowing effect, so this method is not applicable to a large-area process. Furthermore, when a mask contacts a device, scratches and other deficiencies are liable to be generated on the mask or the device, so the shadow mask has a short service life, and the manufacturing cost is increased.

SUMMARY OF THE INVENTION

Accordingly, the present invention is related to a stacked structure, including a soluble organic semiconductor material and a water soluble photosensitive material. The water soluble photosensitive material is disposed on the surface of the soluble organic semiconductor material.

The present invention provides a patterning method. First, a soluble organic semiconductor material is formed on a substrate. Next, a water soluble photosensitive material is formed on the soluble organic semiconductor material. Then, the water soluble photosensitive material is patterned, and a wet etching process is performed with the patterned water soluble photosensitive material as an etching mask to pattern the soluble organic semiconductor material.

The present invention provides an OTFT, including a gate, a gate insulating layer, a source, a drain, an active layer, and a protective layer. The active layer includes a soluble organic semiconductor material. The protective layer is disposed on the surface of the active layer and includes a water soluble photosensitive material.

The present invention provides an OTFT array, which includes a plurality of scan lines, a plurality of data lines, and a plurality of OTFTs. The OTFTs are electrically connected to the scan lines and the data lines. Each of the OTFTs includes a gate, a gate insulating layer, a source, a drain, an active layer, and a protective layer. The active layer includes a soluble organic semiconductor material. The protective layer is disposed on the surface of the active layer and includes a water soluble photosensitive material.

In view of the above, the present invention adopts a wet etching process to pattern a soluble organic semiconductor material. Since a soluble organic semiconductor material is used in the present invention, a large-area soluble organic semiconductor material may be formed by coating, and thus the manufacturing cost is lower.

In order to make the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
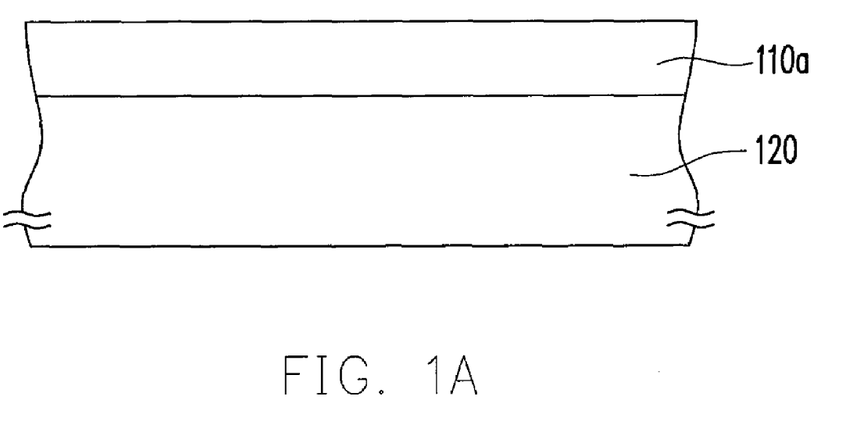
FIGS. 1A to 1D show a method of patterning an organic semiconductor material according to an embodiment of the present invention.
Figure 1B:
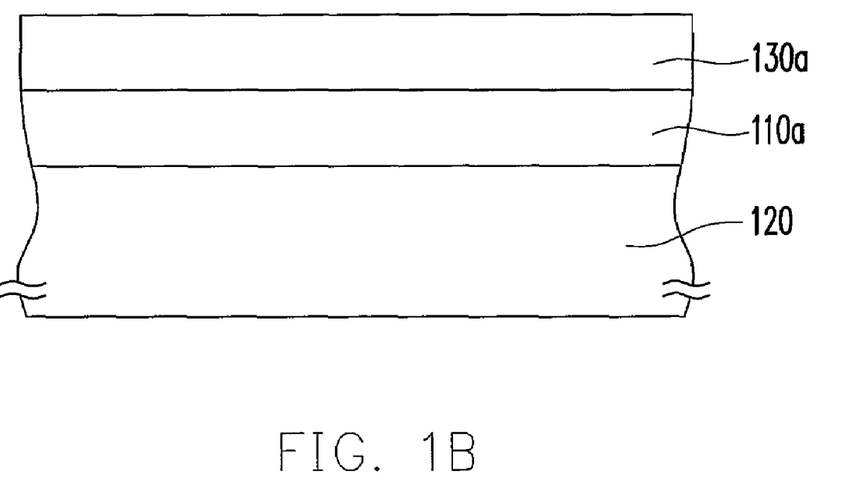
Figure 1C:
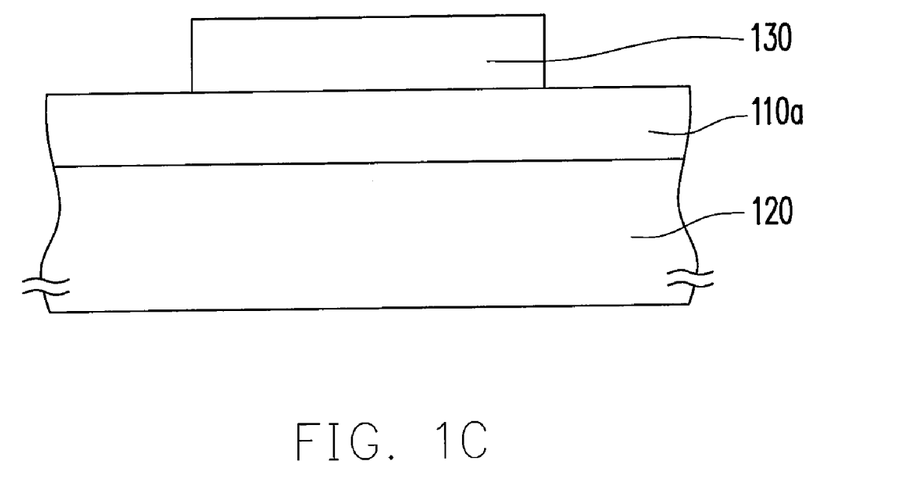
Figure 1D:
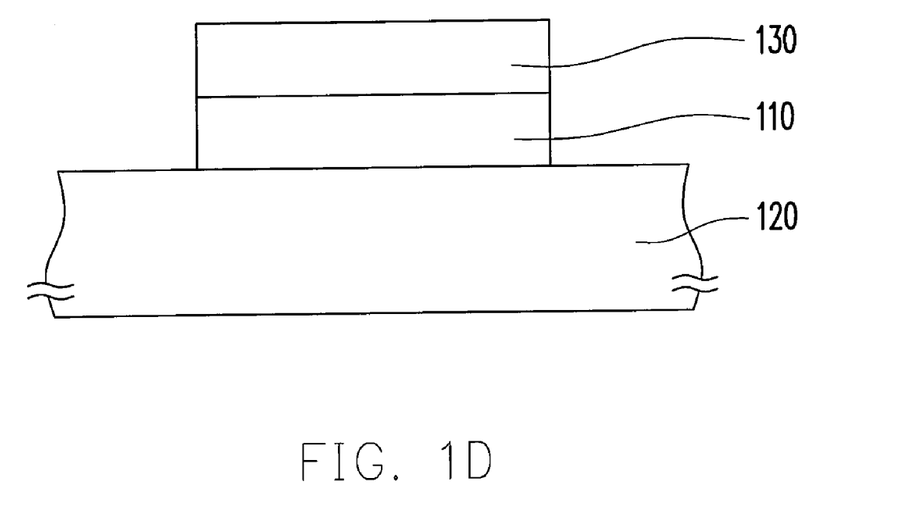

FIG. 1D is a cross-sectional view of a stacked structure according to an embodiment of the present invention. The stacked structure includes a soluble organic semiconductor material 110 disposed on a substrate 120 and a water soluble photosensitive material 130. The water soluble photosensitive material 130 is disposed on a surface of the soluble organic semiconductor material 110. In an embodiment, the water soluble photosensitive material 130 and the soluble organic semiconductor material 110 have a same pattern.

The material of the substrate 120 is, for example, glass, plastic, metal or other suitable materials.

The soluble organic semiconductor material 110 is, for example, a soluble polymer semiconductor material or a soluble small molecular semiconductor material. The soluble polymer semiconductor material may be one selected from a group consisting of polythiophene, polyhexylthiophene, poly (3-hexylthiophene), poly(p-phenylene vinylene), poly(dioctylfluorene-co-benzothiadiazole), polyacetylene, polyprrole, and polyaniline, or derivatives thereof. The soluble small molecular semiconductor material is, for example, a pentacene derivative expressed by one of the following chemical formulas:

The water soluble photosensitive material 130 may be dichromated polyvinyl alcohol (DCPVA) or a waterborne photoresist.

The stacked structure in FIG. 1D may be fabricated by the following method. FIGS. 1A to 1D show a patterning method according to an embodiment of the present invention. Referring to FIG. 1A, first, a soluble organic semiconductor material 110*a* is formed on a substrate 120. The forming method of the soluble organic semiconductor material 110a may be spin coating, blade coating, or dip coating. The materials of the substrate 120 and the soluble organic semiconductor material 110a have been described above, and the details will not be repeated herein.

Next, referring to FIG. 1B, a water soluble photosensitive material 130a is formed on the soluble organic semiconductor material 110a. The material of the water soluble photosensitive material 130a has been described above, and the details will not be repeated herein.

Then, referring to FIG. 1C, the water soluble photosensitive material 130a is patterned to form a patterned water soluble photosensitive material 130. The patterning method of the water soluble photosensitive material 130a is, for example, exposure and development.

And then, referring to FIG. 1D, a wet etching process is performed with the patterned water soluble photosensitive material 130 as an etching mask so as to pattern the soluble organic semiconductor material 110a and form a patterned soluble organic semiconductor material 110. The etchant used in the wet etching process is, for example, a polar solvent or a nonpolar solvent. The etchant may be one selected from a group consisting of isopropyl alcohol (IPA), n-hexane, n-octane, decane, dodecane, water, ethanol, butyl ether, toluene, xylene, tetrahydrofuran (THF), ethyl methyl ketone (MEK), ethyl acetate (EA), acetone, dimethylacetamide (DMAC) and a combination thereof. The etching rate of the wet etching process is, for example, 1 to 1000 Å/sec.

Accordingly, since the patterned water soluble photosensitive material 130 is used as an etching mask to perform the wet etching process to pattern the soluble organic semiconductor material 110 in the present invention, the resolution of the produced pattern may be improved and the manufacturing cost is lower. Furthermore, since the soluble organic semiconductor material 110a is adopted in the present invention, a large-area soluble organic semiconductor material 110a may be formed by coating and the process temperature is low. Further, the materials of the soluble organic semiconductor material 110a, the water soluble photosensitive material 130a, and the etchant of the wet etching process used in the present invention can improve the performance of the formed patterned soluble organic semiconductor material. Furthermore, after the patterned soluble organic semiconductor material is formed, the patterned water soluble photosensitive material 130 thereon may serve as a protective layer.

Figure 2:
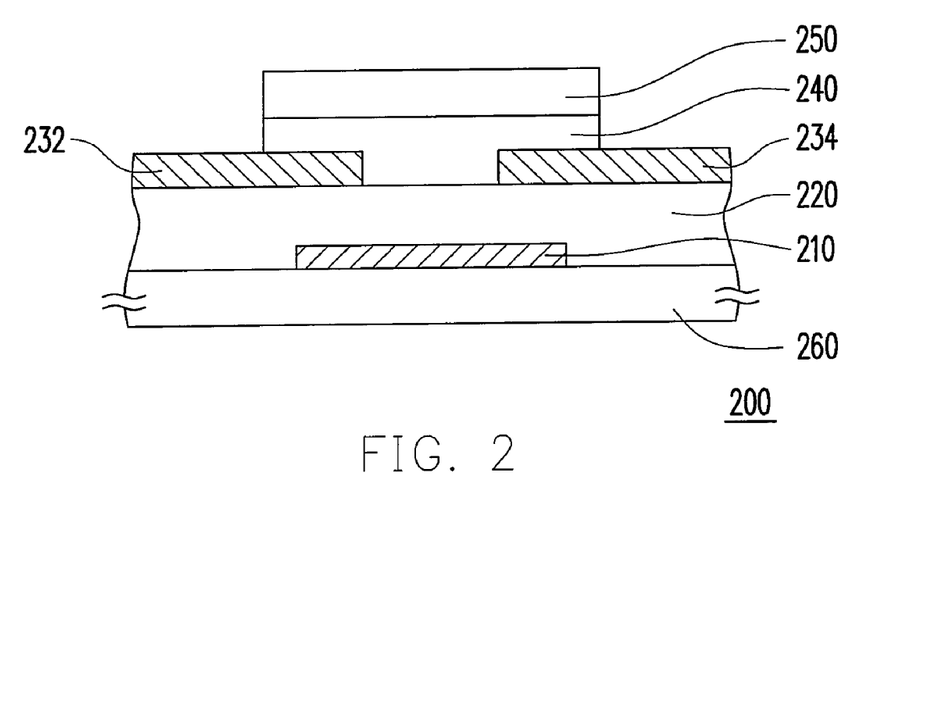
FIG. 2 is a cross-sectional view of an OTFT according to an embodiment of the present invention.

FIG. 2 is a cross-sectional view of an OTFT according to an embodiment of the present invention. Referring to FIG. 2, an OTFT 200 of the present invention includes a gate 210, a gate insulating layer 220, a source 232, a drain 234, an active layer 240, and a protective layer 250. The gate 210 is disposed on a base layer 260. The gate insulating layer 220 covers the gate 210. The source 232 and the drain 234 are disposed on the gate insulating layer 220 at two sides of the gate 210. The material of the gate insulating layer 220 may be silicon oxide, silicon nitride, polyimide (PI), polyvinyl phenol (PVP), or other insulating materials. The materials of the gate 210, the source 232, and the drain 234 are, for example, aluminum, indium tin oxide (ITO), or other conductive materials.

The active layer 240 is located above the gate 210 and disposed between the source 232 and the drain 234, and may be located above the source 232 and the drain 234. The active layer 240 includes a soluble organic semiconductor material, which is, for example, a soluble polymer semiconductor material or a soluble small molecular semiconductor material. The soluble polymer semiconductor material is, for example, one selected from a group consisting of polythiophene, polyhexylthiophene, poly(3-hexylthiophene), poly(p-phenylene vinylene), poly(dioctylfluorene-co-benzothiadiazole), polyacetylene, polyprrole, and polyaniline and a combination thereof, or derivatives thereof. The soluble small molecular semiconductor material is, for example, a pentacene derivative expressed by one of the following formulae:

-continued (c)

The protective layer 250 is disposed on the surface of the active layer 240 and includes a water soluble photosensitive material. The water soluble photosensitive material is, for example, DCPVA or a waterborne photoresist. The active layer 240 and the protective layer 250 may be formed by the steps as shown in FIGS. 1A to 1D. As the pattern of the active layer 240 is transferred by using the water soluble photosensitive material located thereabove as an etching mask, the active layer 240 and the protective layer 250 have a same pattern. The water soluble photosensitive material is unnecessary to be removed after the etching process, so the remained photosensitive material may serve as the protective layer 250.

Figure 3:
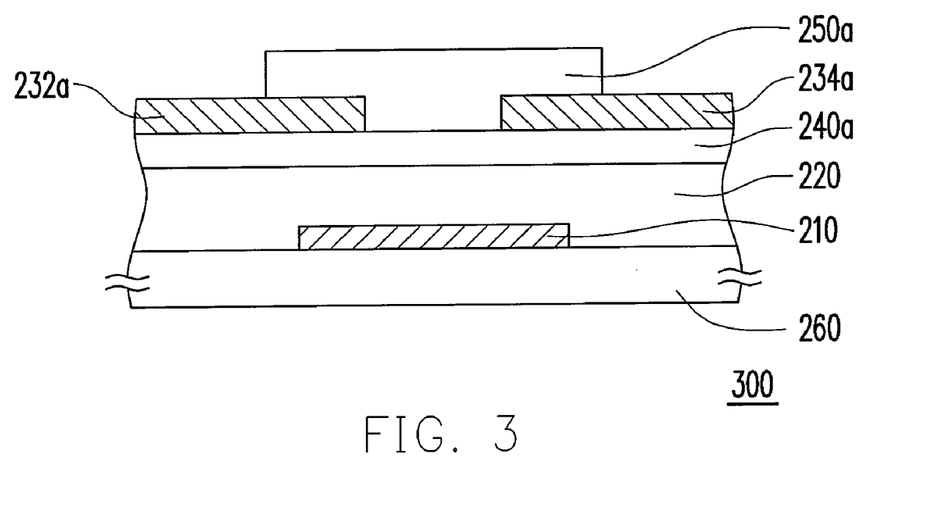
FIG. 3 is a cross-sectional view of another OTFT according to an embodiment of the present invention.

The active layer 240 of the OTFT in the embodiment as shown in FIG. 2 is located above the source 232 and the drain 234. In other embodiments, the active layer of the OTFT may also be located below the source and the drain. As shown in FIG. 3, the source 232a and the drain 234a of the OTFT 300 are located above the active layer 240a, and the protective layer 250a covers a part of or all of the source 232a and the drain 234a and the active layer 240a between the source 232a and the drain 234a.

Hereinafter, several embodiments are exemplified to illustrate the patterning method of the present invention for forming an OTFT, so that the TFT has good working performance.

Figure 4A:
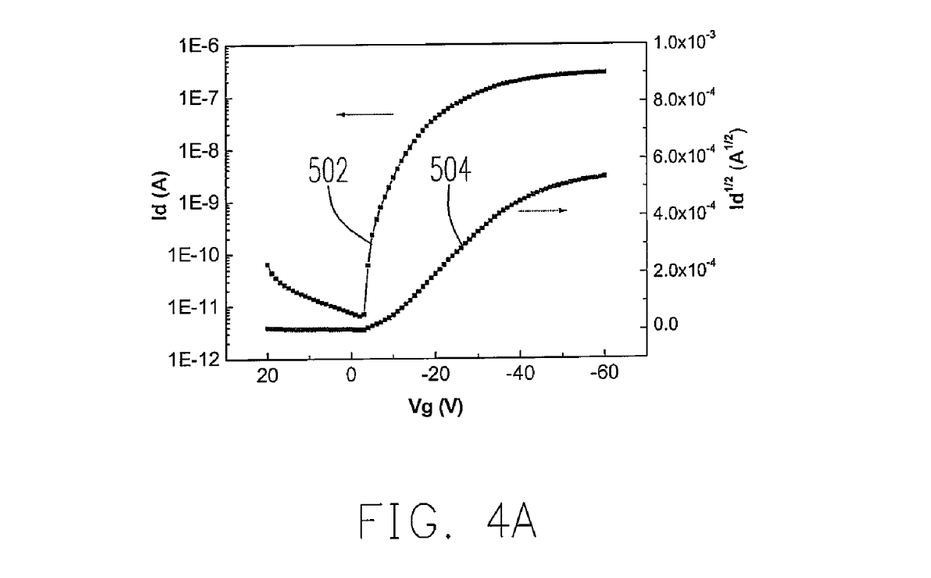
FIG. 4A is an electrical test diagram of a bottom contact OTFT, in which an active layer of the OTFT is not patterned.
Figure 4B:
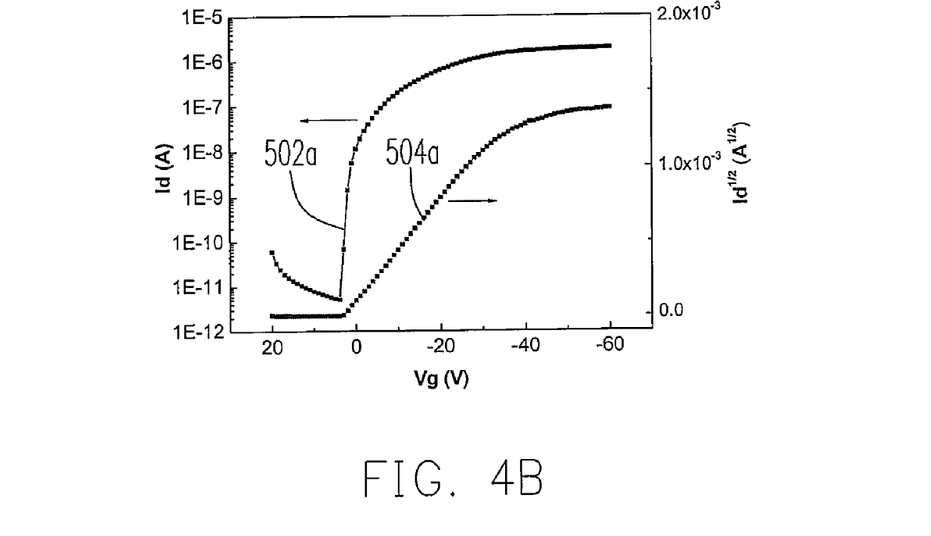
FIG. 4B is an electrical test diagram of another bottom contact OTFT, in which an active layer of the OTFT is patterned.

FIG. 4A is an electrical test diagram of a bottom contact OTFT, in which an active layer of the OTFT is not patterned. FIG. 4B is an electrical test diagram of another bottom contact OTFT, in which an active layer of the OTFT is patterned. A bottom contact OTFT refers to that an active layer is located above the source and the drain. The OTFTs in FIGS. 4A and 4B have a width-length ratio (W/L) of 500 μm/100 μm. Furthermore, in FIGS. 4A and 4B, Vg represents a voltage applied on the gate, Id represents a corresponding current generated at the drain, and $Id^{1/2}$ represents a root of the corresponding current generated at the drain. In FIG. 4A, a curve 502 is a relation curve of the voltage applied on the gate of the OTFT and the corresponding current generated at the drain. A curve 504 is a relation curve of the voltage applied on the gate of the OTFT and the root of the corresponding current generated at the drain. Furthermore, in FIG. 4B, a curve 502a is a relation curve of the voltage applied on the gate of the OTFT and the corresponding current generated at the drain. A curve 504a is a relation curve of the voltage applied on the gate of the OTFT and the root of the corresponding current generated at the drain.

It can be seen from FIGS. 4A and 4B that, the electron mobility of the OTFT in FIG. 4A is $5.9 \times 10^{-3}$ cm$^2$/V.s, and the on/off ratio is $4.3 \times 10^4$. The electron mobility of the OTFT in FIG. 4B is $3.1 \times 10^{-2}$ cm$^2$/V.s, and the on/off ratio is $3.9 \times 10^5$. Thus, it can be known that the OTFT in FIG. 4B has a better performance than the OTFT in FIG. 4A, i.e., the OTFT with a patterned active layer has a better performance than the OTFT with an unpatterned active layer.

Figure 5A:
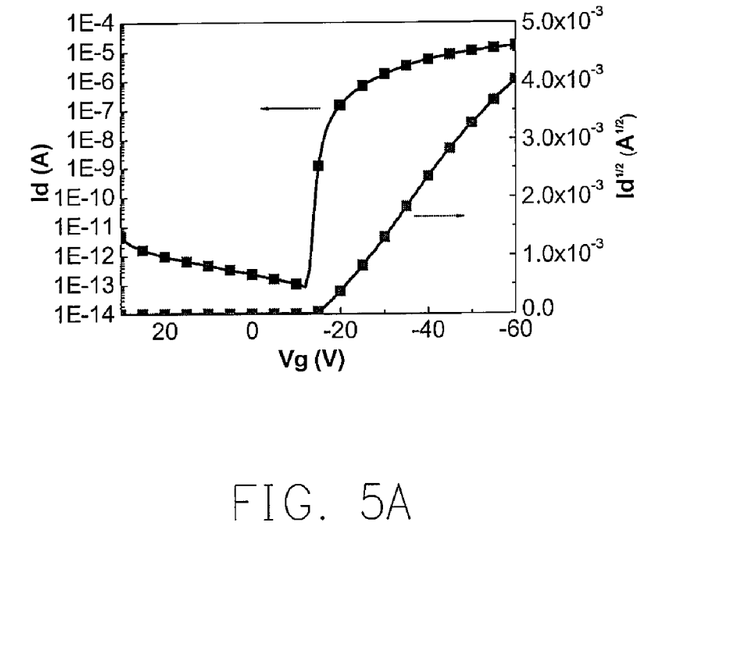
FIGS. 5A and 5B are electrical test diagrams of a top contact OTFT.
Figure 5B:
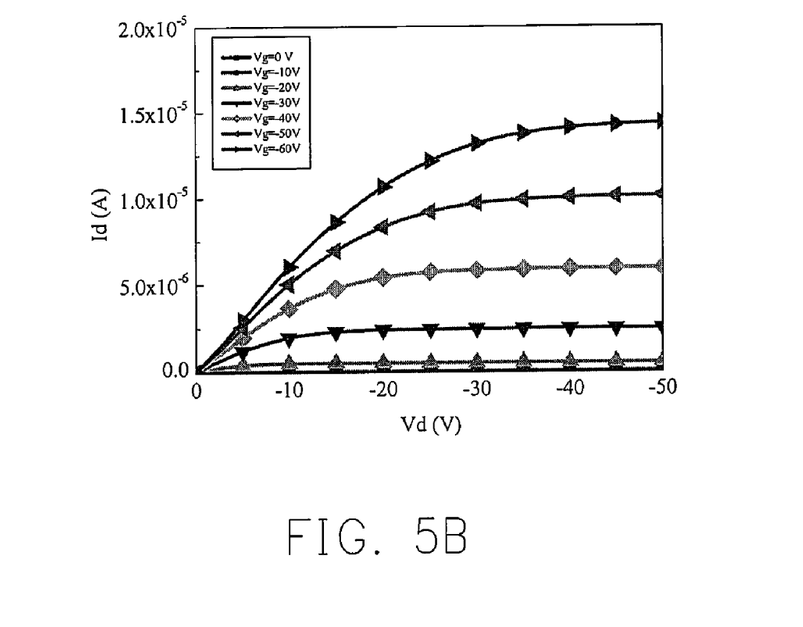

FIGS. 5A and 5B are electrical test diagrams of a top contact OTFT. A top contact OTFT refers to a form that the source and the drain are located above the active layer. In FIGS. 5A and 5B, Vg represents a voltage applied on the gate, Id represents a corresponding current generated at the drain, $Id^{1/2}$ represents a root of the corresponding current generated at the drain, and Vd represents a voltage applied on the drain.

In FIG. 5A, a left curve is a relation curve of the voltage applied on the gate of the OTFT and the corresponding current generated at the drain. The right curve is a relation curve of the voltage applied on the gate of the OTFT and the root of the corresponding current generated at the drain. Furthermore, in FIG. 5B, all curves are relation curves of the drain voltage and the corresponding current generated at the drain when different voltages are applied on the gate of OTFT.

It can be seen from FIGS. 5A and 5B that, the electron mobility of the top contact OTFT is 0.34 cm$^2$/V.s, and the on/off ratio is $1.70 \times 10^8$. Thus, it can be seen from FIGS. 5A and 5B that, the top contact OTFT also has excellent performance.

In practical application, the OTFTs are generally arranged in an array to be applied in the fabrication of the display panel. Hereinafter, an embodiment of the application of the OTFT in the OTFT array of a display panel is introduced.

Figure 6:
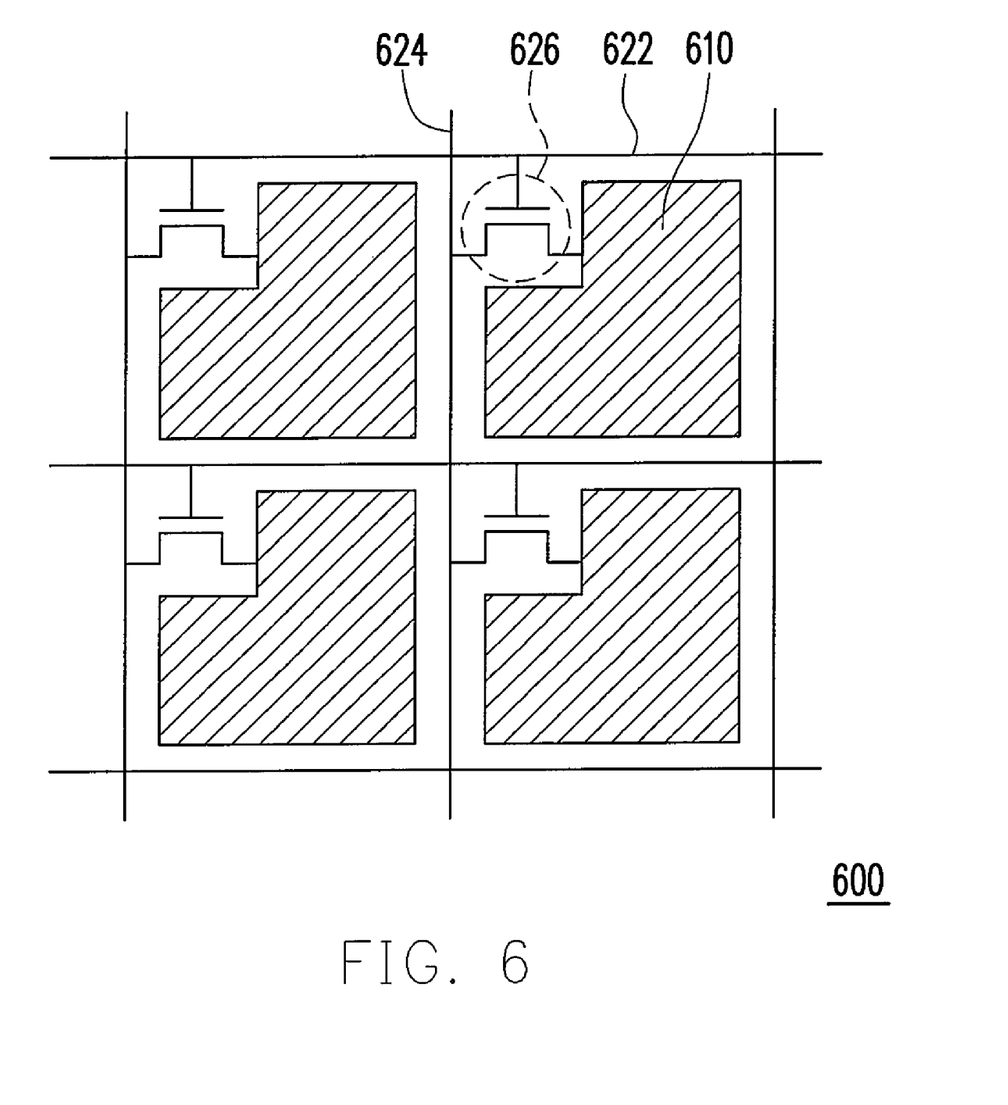
FIG. 6 is a schematic view of a pixel array containing an OTFT array of the present invention.

FIG. 6 is a schematic view of a pixel array including the OTFT array of the present invention. Referring to FIG. 6, a pixel array 600 includes a plurality of pixel electrodes 610 and an OTFT array of the present invention. The OTFT array includes a plurality of scan lines 622, a plurality of data lines 624, and a plurality of OTFTs 626. The OTFTs 626 may be the OTFTs 200 (as shown in FIG. 2) or OTFTs 300 (as shown in FIG. 3). The OTFTs 626 are electrically connected to the scan lines 622 and the data lines 624. The materials of the scan lines 622 and the data lines 624 may be aluminum, aluminum-neodymium alloy, aluminum-germanium-gadolinium alloy, molybdenum, molybdenum nitride, titanium, gold, copper, or other suitable materials.

Generally speaking, the OTFT array and the plurality of pixel electrodes 610 form a pixel array, in which the OTFTs 626 and the pixel electrode 610 are electrically connected. The material of the pixel electrode 610 may be indium tin oxide (ITO), indium zinc oxide (IZO), and other suitable materials.

The OTFT array may be applied not only in liquid crystal displays (LCDs), but also in organic light-emitting diode displays (OLED) and polymer dispersed LCDs, and so on. As each film of the OTFT may be formed at a low temperature, the OTFT is applicable to the fabrication of flexible display panels.

Furthermore, the OTFT array of the present invention may further be applied in organic solar cells, sensors, RFID-tags, and so on.

As a patterned water soluble photosensitive material is used as an etching mask to perform a wet etching process to pattern a soluble organic semiconductor material in the present invention, the resolution of the produced pattern may be improved and the manufacturing cost is lower. Furthermore, as the soluble organic semiconductor material is adopted in the present invention, a large-area soluble organic semiconductor material may be formed by coating and the process temperature is low. Further, the soluble organic semiconductor material, the water soluble photosensitive material, and an etchant of the wet etching process used in the present invention can improve the performance of the formed patterned soluble organic semiconductor material. Furthermore, after forming the patterned soluble organic semiconductor material, the patterned water soluble photosensitive material thereon may serve as a protective layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A patterning method, comprising:
   forming a soluble organic semiconductor material;
   forming a water soluble photosensitive material directly on the soluble organic semiconductor material;
   patterning the water soluble photosensitive material; and
   performing a wet etching process with the patterned water soluble photosensitive material layer as an etching mask, so as to pattern the soluble organic semiconductor material, wherein an etchant of the wet etching process is a nonpolar solvent,
   wherein the soluble organic semiconductor material comprises a soluble polymer semiconductor material or a soluble small molecular semiconductor material,
   wherein the soluble polymer semiconductor material is one selected from a group consisting of polyhexylthiophene, poly(3-hexylthiophene), poly(dioctylfluorene-co-benzothiadiazole), polyacetylene, polyprrole, polyaniline and a combination thereof, or derivatives thereof, and
   wherein the soluble small molecular semiconductor material comprises a pentacene derivative expressed by one of following chemical formulae:

2. The patterning method as claimed in claim 1, wherein the water soluble photosensitive material comprises DCPVA or a waterborne photoresist.

3. The patterning method as claimed in claim 1, wherein the etchant of the wet etching process is one selected from a group consisting of n-hexane, n-octane, decane, dodecane, butyl ether, toluene, xylene, and a combination thereof.

4. The patterning method as claimed in claim 1, wherein an etching rate of the wet etching process is 1 to 1000 Å/sec.

5. The patterning method as claimed in claim 1, wherein a forming method of the soluble organic semiconductor material comprises spin coating, blade coating, or dip coating.

* * * * *